United States Patent
Chuang

(10) Patent No.: US 9,144,160 B2
(45) Date of Patent: Sep. 22, 2015

(54) HOLDER FOR DIGITAL PRODUCTS

(71) Applicant: EHOMA INDUSTRIAL CORPORATION, Taichung (TW)

(72) Inventor: Chun-Huan Chuang, Taichung (TW)

(73) Assignee: EHOMA INDUSTRIAL CORPORATION, Taichung (TW)

( * ) Notice: Subject to any disclaimer, the term of this patent is extended or adjusted under 35 U.S.C. 154(b) by 95 days.

(21) Appl. No.: 14/060,400

(22) Filed: Oct. 22, 2013

(65) Prior Publication Data

US 2015/0108306 A1    Apr. 23, 2015

(51) Int. Cl.
*F16M 11/14* (2006.01)
*F16M 13/02* (2006.01)
*H05K 5/02* (2006.01)
*G03B 17/56* (2006.01)

(52) U.S. Cl.
CPC ............. *H05K 5/0204* (2013.01); *F16M 11/14* (2013.01); *F16M 13/022* (2013.01); *G03B 17/561* (2013.01)

(58) Field of Classification Search
CPC ..... F16M 13/00; F16M 13/022; F16M 11/04; F16M 11/14; F16M 11/2035
USPC ................. 248/226.11, 228.1, 228.4, 231.51, 248/187.1, 288.31, 181.1, 181.2; 396/419, 396/428
See application file for complete search history.

(56) References Cited

U.S. PATENT DOCUMENTS

| | | | |
|---|---|---|---|
| 1,343,641 A * | 6/1920 | Patterson | 294/85 |
| 2,589,520 A * | 3/1952 | Wallenius | 248/177.1 |
| 4,799,639 A * | 1/1989 | Riley | 248/228.4 |
| 5,690,416 A * | 11/1997 | Van Gennep | 362/191 |
| 7,254,895 B1 * | 8/2007 | O'Donnell | 33/293 |
| 7,926,774 B1 * | 4/2011 | Wilson | 248/229.14 |
| 8,602,662 B1 * | 12/2013 | Mans | 396/428 |
| 2004/0089778 A1 * | 5/2004 | Valentine et al. | 248/229.13 |
| 2005/0035249 A1 * | 2/2005 | Busuito | 248/215 |
| 2010/0108838 A1 * | 5/2010 | DeMartine et al. | 248/222.14 |
| 2013/0193288 A1 * | 8/2013 | Congdon | 248/231.41 |
| 2013/0289536 A1 * | 10/2013 | Croizat et al. | 604/543 |
| 2014/0110895 A1 * | 4/2014 | Chang | 269/56 |
| 2014/0191094 A1 * | 7/2014 | Esarey | 248/170 |

* cited by examiner

*Primary Examiner* — Ryan Kwiecinski
(74) *Attorney, Agent, or Firm* — Muncy, Geissler, Olds & Lowe, P.C.

(57) ABSTRACT

A holder for digital products includes a first arm, a second arm, a screw rod, and a fixing assembly. Therein, the first arm has a first gripping end and a connecting end. The second arm is pivotally connected to the first arm and has a second gripping end. The screw rod is rotatably disposed between the second arm and the connecting end for enabling the first gripping end and the second gripping end to cooperatively grip on an object. The fixing assembly is disposed on the second arm for combining a digital product, whereby the digital product can be held on an appropriate position.

13 Claims, 7 Drawing Sheets

HOLDER FOR DIGITAL PRODUCTS

BACKGROUND OF THE INVENTION

1. Field of the Invention

The present invention relates to holders, and more particularly, to a holder for digital products to be combined thereon for stably holding at appropriate positions.

2. Description of the Related Art

With the advancement of technology, 3C digital products are designed with slim, short, and small structures for meeting user's expectations and demands. Popular digital products are rich in variety, including digital cameras, smart phones, and tablet computers.

Digital cameras, with different functions, can generally be categorized into digital single lens reflex cameras, digital SLR-like cameras, digital electronic viewfinder interchangeable lens cameras, and general digital cameras. There are differences among not only their functions, but also their volumes and applicable assemblies. For photographing ideal pictures of scenes, character, photographers themselves, or groups of people, tripods are often used for positioning digital cameras and preventing the cameras from shaking or swaying during pictures shooting. However, traditional tripods have comparatively large volume, thus inconvenient for storage or being carried. Also, tripods can only stand on floors or planes without any fixing means, thereby easily toppled by external force, thus failing to meet user's demands for photographing.

SUMMARY OF THE INVENTION

For solving issues aforementioned, the present invention provides a holder for digital products. Being positioned on the holder, digital products can be stably held onto an object or be directly put on a plane steadily with the holder.

The holder for digital products of the present invention comprises: a first arm, a second arm, a screw rod, and a fixing assembly. Therein, the first arm has a first gripping end and a connecting end. The second arm is pivotally connected to the first arm and has a second gripping end. The screw rod is rotatably disposed between the second arm and the connecting end for enabling the first gripping end and the second gripping end to cooperatively grip on an object. The fixing assembly is disposed on the second arm for a digital product to be coupled with. Thereby, the digital product is allowed to be stably held on appropriate positions of platforms, tubes, or block-shaped objects, or be directly put on a plane with the digital product positioned on the holder.

Further, the screw rod is provided with a nut, and the connecting end is provided with a rod sleeve. When the nut tightly resists against the rod sleeve, the adjustment between the rod sleeve and the screw rod is limited, thereby enabling the holder, with the digital product positioned thereon, to be steadily put on a plane, and preventing the holder from toppling.

DETAILED DESCRIPTION OF THE INVENTION

Other and further advantages and features of the present invention will be understood by reference to the description of the preferred embodiment in conjunction with the accompanying drawings where the components are illustrated based on a proportion for explanation but not subject to the actual component proportion.

Figure 1:
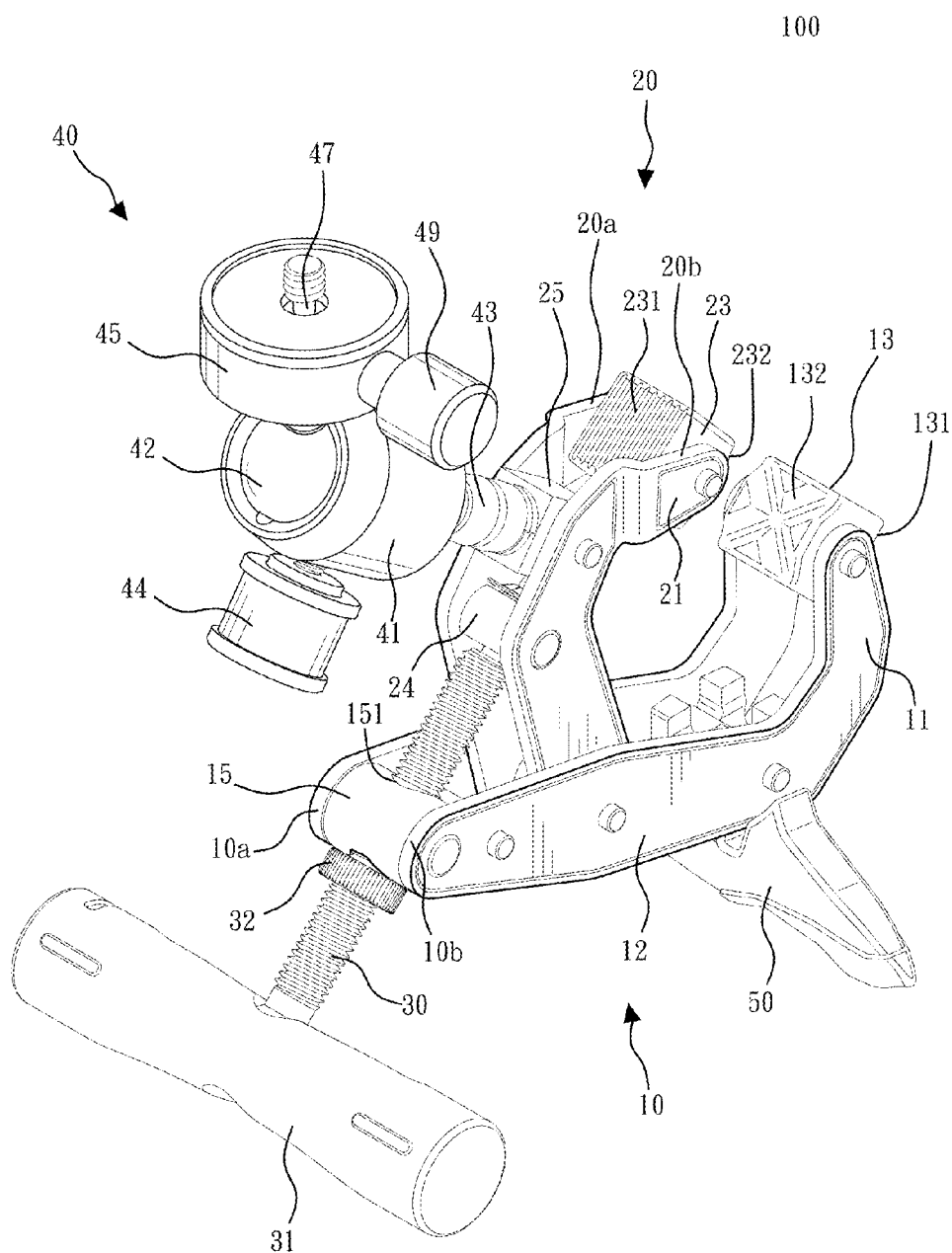
FIG. 1 is a perspective view of the holder in accordance with the present invention.
Figure 2:
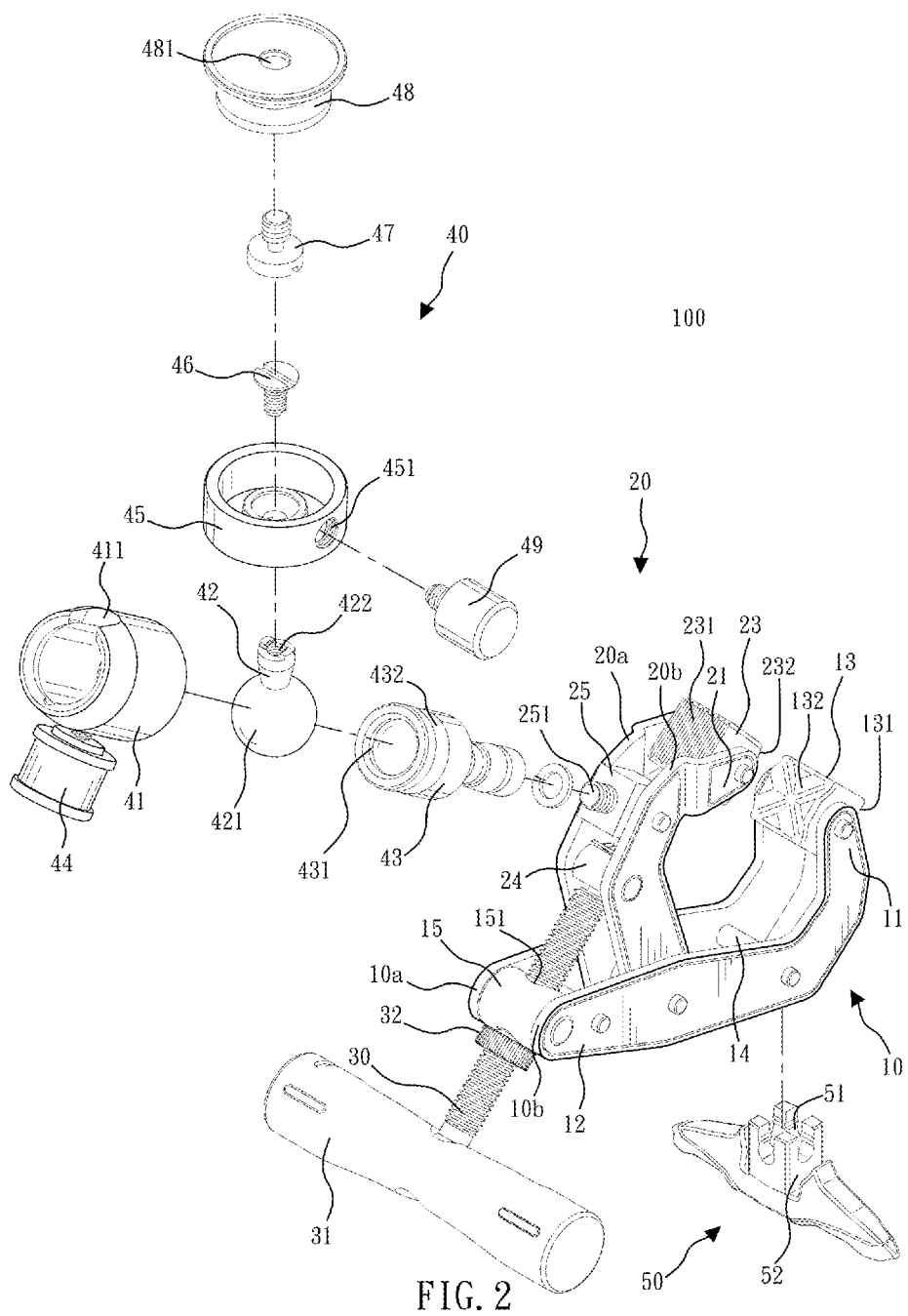
FIG. 2 is an exploded view of the holder in accordance with the present invention.
Figure 3:
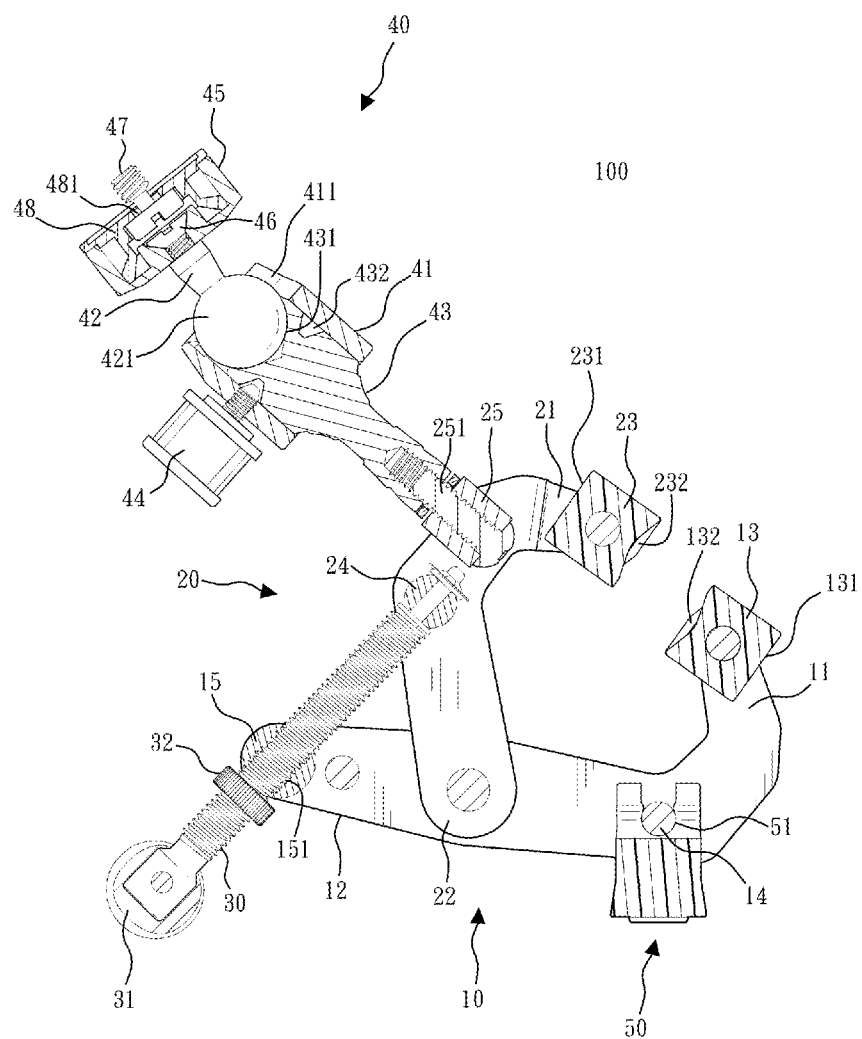
FIG. 3 is a sectional view of the holder in accordance with the present invention.

Referring to FIG. 1 to FIG. 3, a holder 100 of the present invention comprises a first arm 10, a second arm 20, a screw rod 30, a fixing assembly 40, and a foot 50.

The first arm 10 comprises two symmetrical metal plates 10a, 10b parallely connected. The first arm 10 is provided with a first gripping end 11 and a connecting end 12, wherein the first gripping end 11 is pivotally provided with a first gripping member 13. The first gripping member 13 has at least one gripping surface 131 and at least one X-shaped grip groove 132. The gripping surface 131 is provided with equidistant concave strips. Also, a connecting axle 14 is provided between the first gripping end 11 and the connecting end 12, wherein a rod sleeve 15, possessing a screw hole 151, is rotatably disposed on the connecting end 12.

The second arm 20 comprises two symmetrical metal plates 20a, 20b parallely connected. The second arm 20 is provided with a second gripping end 21 and a pivoting end 22, wherein the second gripping end 21 is pivotally provided with a second gripping member 23. The second gripping member 23 has at least one gripping surface 231 and at least one X-shaped grip groove 232. The gripping surface 231 is provided with equidistant concave strips. The second gripping member 23 is substantially a same structure with the first gripping member 13. The pivoting end 22 of the second arm 20 is pivotally connected to the first arm 10, and particularly connected to the position between the connecting axle 14 and the connecting end 12. Further, the second arm 20 is provided with a positioning axle 24 in the space between the two metal plates 20a, 20b, and a combining part 25 with a fixing screw 251 protruding thereon, is disposed in the space between the two metal plates 20a, 20b, adjacent to the second gripping end 21.

The screw rod 30 screws through the screw hole 151 of the rod sleeve 15, movably disposed on the positioning axle 24, and rotatably disposed between the second arm 20 and the connecting end 12, thereby controlling the pivotal swing of the second arm 20 against the first arm 10 and enabling the first gripping member 13 and the second gripping member 23 to cooperatively grip. Further, the other end of the screw rod 30 opposite to the second arm 20 is provided with a shaft 31 for handling and adjusting the screw rod 30. Also, a nut 32 is disposed on the screw rod 30 adjacent to the rod sleeve 15. Thereby, when the nut 32 tightly resists against the rod sleeve 15, the screw rod 30 is prevented from moving against the rod sleeve 15, causing a positioning function.

One end of the fixing assembly 40 is disposed on the second arm 20, and the other end is coupled with a digital product. Therein, the fixing assembly 40 comprises a barrel sleeve 41, a rotator 42, a limiter 43, and a first bolt 44. The barrel sleeve 41 has a neck end and a head end, wherein the head end has a notch 411. The rotator 42 has a ball part 421, while the rotator 42 is sleeved by the barrel sleeve 41 with the ball part 421 mated with the notch 411 for preventing the rotator 42 from displacing from the barrel sleeve 41. The rotator 42 is allowed to rotate toward various directions against the barrel sleeve 41. One end of the limiter 43 is screwed and fixed by the fixing screw 251, while the other end is provided with a concave 431 for receiving the ball part 421. Also, the limiter 43 has a sleeve ring 432 for the first bolt 44, which is installed through the barrel sleeve 41, to optionally securing the sleeve ring 432, thereby limiting the rotation of the rotator 42 against the barrel sleeve 41.

The fixing assembly 40 further comprises a fixing ring 45, a first screw 46, a second screw 47, a holding member 48, and a second bolt 49. Therein, the first screw 46 passes through the fixing ring 45 and screws in a screw hole 422 of the rotator 42, whereby the fixing ring 45 is connected with the rotator 42. The holding member 48 is received in the fixing ring 45. The second screw 47 passes a through hole 481 of the holding member 48 with the screw thread exposed for screwing a digital product. The second bolt 49 screws in a screw hole 451 of the fixing ring 45 for optionally securing the periphery of the holding member 48, in order to prevent the holding member 48 from displacing from the fixing ring 45.

The foot 50 is present as a strip shape with a cross-shaped recess 51 in the middle, while two pits 52 are disposed on the both sides of the recess 51, respectively. The recess 51 of the foot 50 receives the connecting axle 14, and the two pits 52 are coupled with the two metal plates 10a, 10b, whereby the foot 50 is allowed to be detachably combined with the first arm 10, either longitudinally or transversely. When the foot 50 is transversely combined with the first arm 10 with the use of the shaft 31 transversely disposed, the holder 100 can steadily stand on a plane; meanwhile, when the nut 32 tightly resists against the rod sleeve 15, the holder 100 becomes a foot stand of digital products and is thereby prevented from toppling due to the unstableness of center of gravity.

Figure 4:
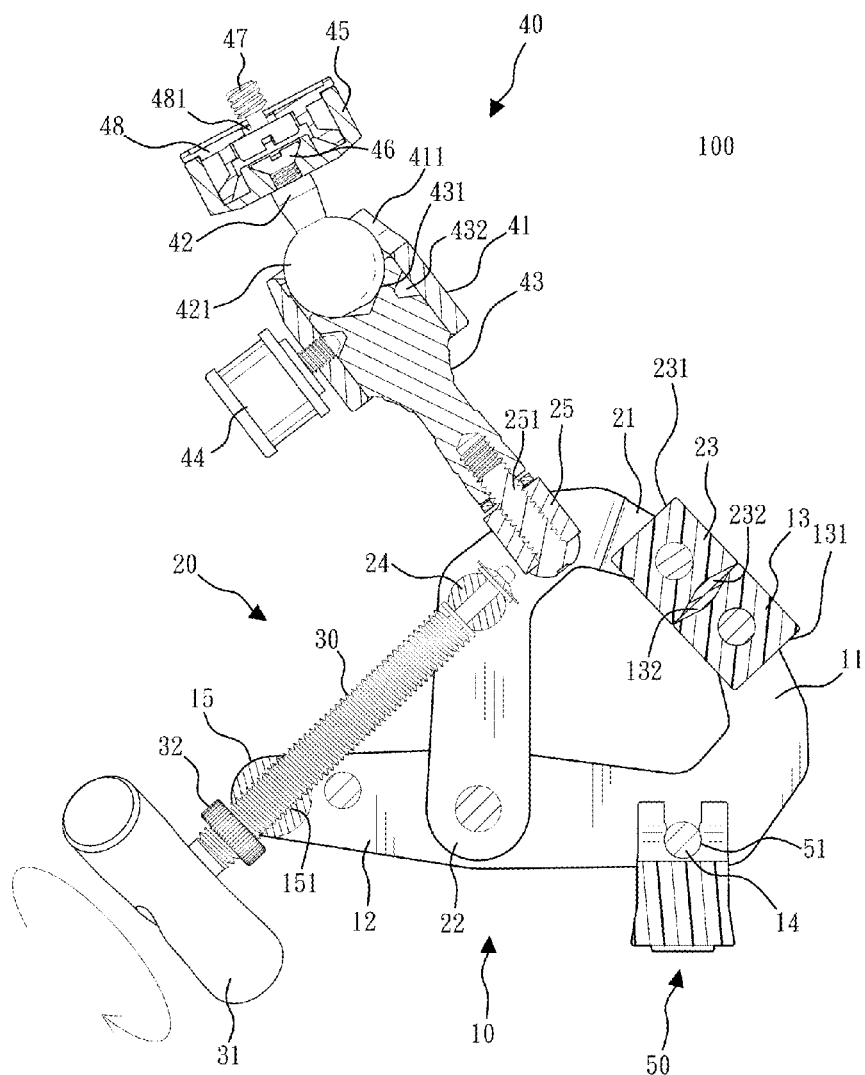
FIG. 4 is a schematic sectional view illustrating the holder in gripping motion.

Referring to FIG. 4, when the shaft 31 of the screw rod 30 is being rotationally driven, the screw rod 30 is forced to rotate against the rod sleeve 15, thereby causing the screw rod 30 to move forward or backward against the connecting end 12. Particularly, when the screw rod 30 rotates in a clockwise direction, one end of the screw rod 30 opposite to the end disposed with the shaft 31 pushes the second arm 20, whereby the second arm 20 pivotally swings against the first arm 10, causing the first gripping member 13 and the second gripping member 23 to cooperatively grip, and enabling the holder 100 to grip on an object.

Figure 5:
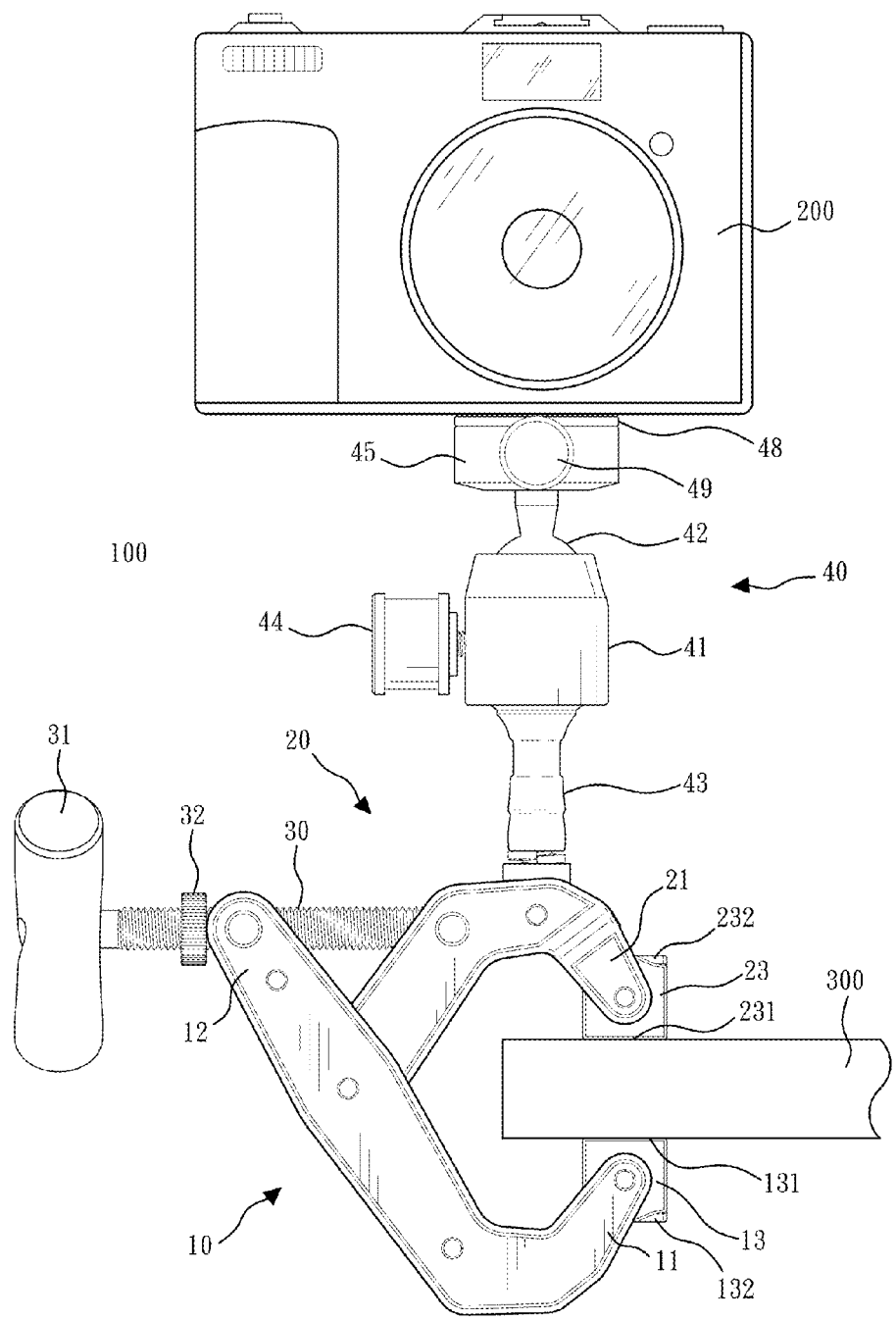
FIG. 5 is a schematic applied view illustrating the holder gripping on a plane.

Referring to the embodiment illustrated by FIG. 5, a digital camera 200 is combined and fixed to the second arm 20 of the holder 100 by the fixing assembly 40. With the aforementioned adjustment, the holder 100 grips on two lateral sides of a plane 300 by the gripping surfaces 131, 231 of the first and second gripping members 13, 23, thereby stably holding the digital camera 200 on the plane 300. Thus, the digital camera 200 is prevented from toppling due to external force, and produces high quality photographs. Therein, the plane 300 can be substituted with any other objects possessing a flat surface or similar structures, such as tubes with a rectangular outer shape, for the application of the present invention.

Figure 6:
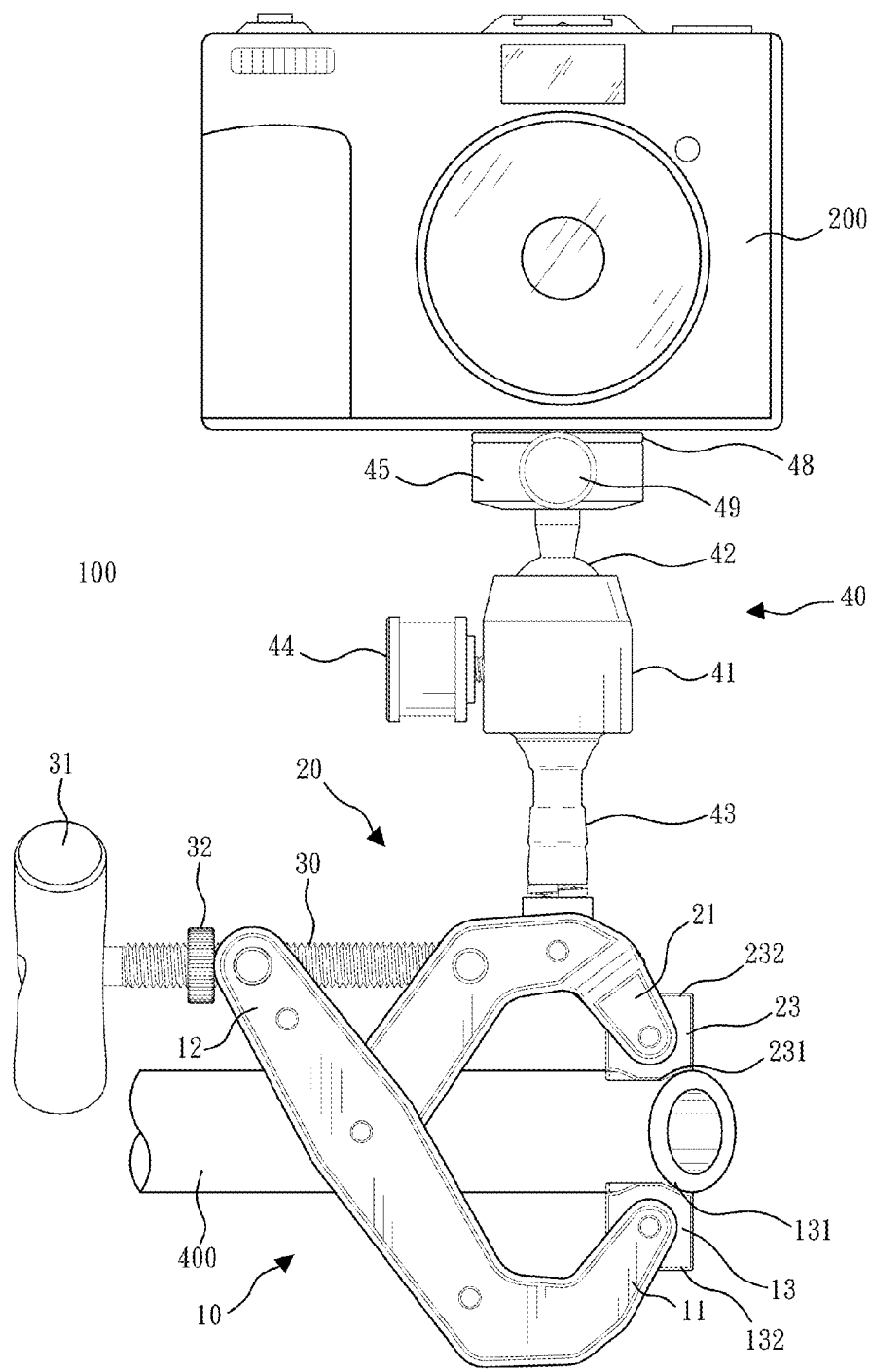
FIG. 6 is another schematic applied view illustrating the holder gripping on a circular tube.

Referring to FIG. 6, the present invention can also grip on a circular tube 400. The holder 100 grips on the circular tube 400 by the grip grooves 132, 232 that are present as an X shape of the first and second gripping members 13, 23, whereby the digital camera 200 is stably held on the circular tube 400 by the holder 100. With the two grip grooves 132, 232, the holder 100 is also allowed to grip on block-shaped objects. Thereby, the first and second gripping members 13, 23 can be rotated for user's convenience.

Figure 7:
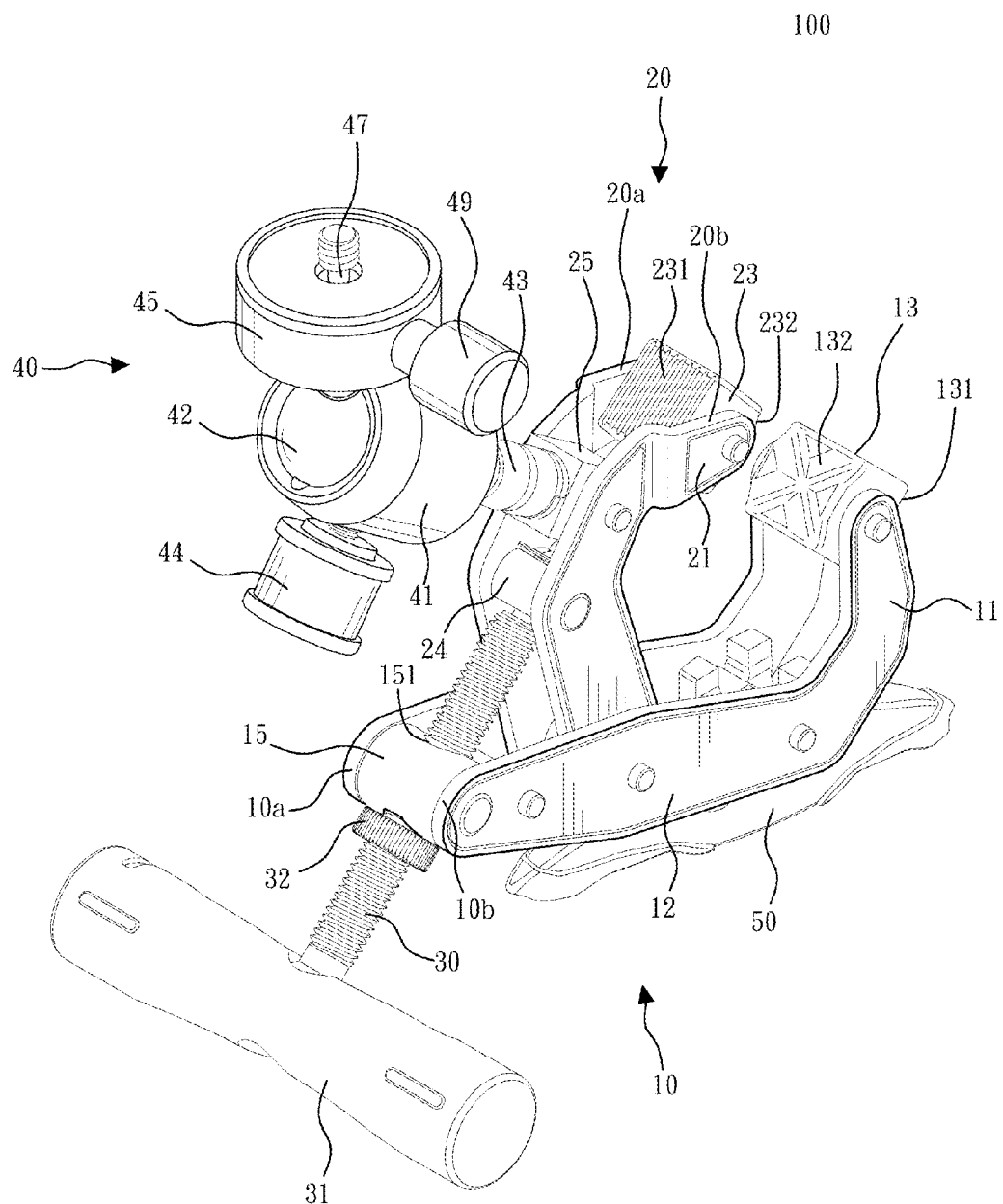
FIG. 7 is still another schematic applied view illustrating the foot of the present invention longitudinally combined to the first arm.

Referring to FIG. 7, when the holder 100 of the present invention is in storage, the foot 50 can be longitudinally combined with the first arm 10 by coupling the recess 51 and the connecting axle 14, thereby decreasing the transverse space occupied by the holder 100, which is convenient for storage and preservation.

Therefore, the holder for digital products of the present invention can grip on different objects, such as circular tubes, block-shaped objects, planes, or flat surfaces, whereby the digital products can be fixed on appropriate positions without limitation of place and space to meet user's demands for photographing.

Also, each of the first arm and the second arm are made of two metal plates mutually connected, and the gripping mechanism of the first and second arms is controlled by the adjustment of the screw rod, whereby the force of gripping of the present invention is adequate that issues of loosening or detaching of the grips are prevented.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A holder for digital products, comprising:
   a first arm, provided with a first gripping end;
   a second arm pivotally connecting to the first arm, provided with a second gripping end;
   a screw rod, rotatably disposed between the first arm and the second arm for adjusting pivotal swings of the second arm against the first arm, thereby enabling the first gripping end and the second gripping end to cooperatively grip on an object;
   a fixing assembly, comprising a first end disposed on the second arm and a second end configured to engage and support a digital product;
   a nut, screwed on the screw rod; and
   a foot detachably combined to the first arm, one end of the screw rod away from the second arm provided with a shaft, whereby the holder steadily stands on a platform by use of the foot and the shaft.

2. The holder of claim 1, wherein the first arm is provided with a connecting end, and the screw rod is disposed between the second arm and the connecting end.

3. The holder of claim 2, wherein the second arm is provided with a combining part having a fixing screw exposed thereon, wherein the fixing assembly is screwed upon the fixing screw.

4. The holder of claim 3, wherein the fixing assembly comprises a barrel sleeve, a rotator disposed in the barrel sleeve and capable of rotating against the barrel sleeve toward different directions, a limiter having a first end screwed on to the fixing screw and a second end resisting against the rotator, and a first bolt passing through the barrel sleeve for securing the limiter, thereby limiting the rotation of the rotator against the barrel sleeve.

5. The holder of claim 4, wherein the limiter is provided with a ring sleeve, such that the first bolt is optionally screwed to the ring sleeve.

6. The holder of claim 4, wherein the fixing assembly further comprises a fixing ring, a holding member, a second screw, and a second bolt, the first screw passing through the fixing ring to fix on one end of the rotator, the holding member received in the fixing ring, the second screw passing the holding member and exposing toward a direction away from the first screw for screwingly engaging the digital product, and the second bolt screwing through the fixing ring for preventing the holding member from displacing from the fixing ring.

7. The holder of claim 2, wherein a rod sleeve is rotatably provided on the connecting end for the screw rod to pass through.

8. The holder of claim 7, wherein the nut tightly resists against the rod sleeve for limiting adjusting capability of the screw rod against the rod sleeve.

9. The holder of claim 7, wherein a positioning axle is transversely disposed within the second arm for one end of the screw rod to be movably disposed on.

10. The holder of claim 1, wherein the first gripping end is pivotally provided with a first gripping member and the second gripping end is pivotally provided with a second gripping member, while each of the first gripping member and the second gripping member is provided with at least one gripping surface.

11. The holder of claim 10, wherein each of the first gripping member and the second gripping member is provided with at least one grip groove present as an X shape.

12. The holder of claim 1, wherein a connecting axle is transversely disposed within the first arm, and the foot is formed as a strip shape, wherein a cross-shaped recess is disposed in the middle of the foot, such that the foot engages the first arm, either transversely or longitudinally.

13. The holder of claim 12, wherein two sides of the recess are provided with a pit, respectively, and the first arm is made of two symmetrical plates, wherein the two pits are coupled with the two plates.

\* \* \* \* \*